US009933467B1

(12) United States Patent
Stein et al.

(10) Patent No.: US 9,933,467 B1
(45) Date of Patent: Apr. 3, 2018

(54) GROUP DELAY MEASUREMENT APPARATUS AND METHOD

(71) Applicant: Guzik Technical Enterprises, Mountain View, CA (US)

(72) Inventors: Anatoli B. Stein, Atherton, CA (US); Alexander Taratorin, Palo Alto, CA (US); Semen P. Volfbeyn, Palo Alto, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 0 days.

(21) Appl. No.: 15/267,451

(22) Filed: Sep. 16, 2016

(51) Int. Cl.
*G01R 23/175* (2006.01)
*G01R 23/02* (2006.01)

(52) U.S. Cl.
CPC ........... *G01R 23/175* (2013.01); *G01R 23/02* (2013.01)

(58) Field of Classification Search
CPC .................................................... G01R 23/175
See application file for complete search history.

(56) References Cited

U.S. PATENT DOCUMENTS

| 3,573,611 A * | 4/1971 | Bergemann ............ H04B 3/462 324/606 |
| 3,769,585 A * | 10/1973 | Fremouw ................. G01S 7/40 324/76.52 |
| 4,039,769 A * | 8/1977 | Bradley ................. H04B 3/462 324/621 |
| 8,983,796 B2 | 3/2015 | Bednorz et al. | |

FOREIGN PATENT DOCUMENTS

EP  1515147 A1  3/2005

OTHER PUBLICATIONS

Agilent Technologies, Application Note 5965-7707E, "Understanding the Fundamental Principles of Vector Network Analysis," http://cp.literature.agilent.com/litweb/pdf/5965-7707E.pdf; published in the U.S. Dec. 12, 2012.

* cited by examiner

*Primary Examiner* — John Breene
*Assistant Examiner* — Jeffrey C Morgan
(74) *Attorney, Agent, or Firm* — Burns & Levinson, LLP; Joseph M. Maraia

(57) ABSTRACT

Measurement of group delay for a device under test (DUT). A test signal includes (i) a low frequency sine wave $f_{LF}$, (ii) sine wave harmonics at a high frequency $f_{HF}$, (iii) L pairs of sideband components at frequencies $k \cdot f_{HF} \pm 2 \cdot f_{LF}$, where k odd, and M pairs of sideband components at frequencies $k \cdot f_{HF} \pm f_{LF}$, where k is even. At DUT output, (i) phase $\phi_{LF}$ at frequency $f_{LF}$ is measured, (ii) both sideband phase $\phi_{right}(k)$ at frequencies $k \cdot f_{HF} + 2 \cdot f_{LF}$ and phase $\phi_{left}(k)$ at frequencies $k \cdot f_{HF} - 2 \cdot f_{LF}$ for odd k, are measured, and (iii) both sideband phases $\phi_{right}(k)$ at frequencies $k \cdot f_{HF} + f_{LF}$ and $\phi_{left}(k)$ at frequencies $k \cdot f_{HF} - f_{LF}$ for even k, are measured. Group delay $\tau_k$ at frequencies $k \cdot F_{HF}$, are determined from: $\tau_k = (\phi_{right}(k) - \phi_{left}(k) - 4 \cdot \phi_L)/(4 \cdot f_{LF})$ for k odd, and $\tau_k = (\phi_{right}(k) - \phi_{left}(k) - 2 \cdot \phi_L)/(2 \cdot f_{LF})$ for k even.

24 Claims, 7 Drawing Sheets

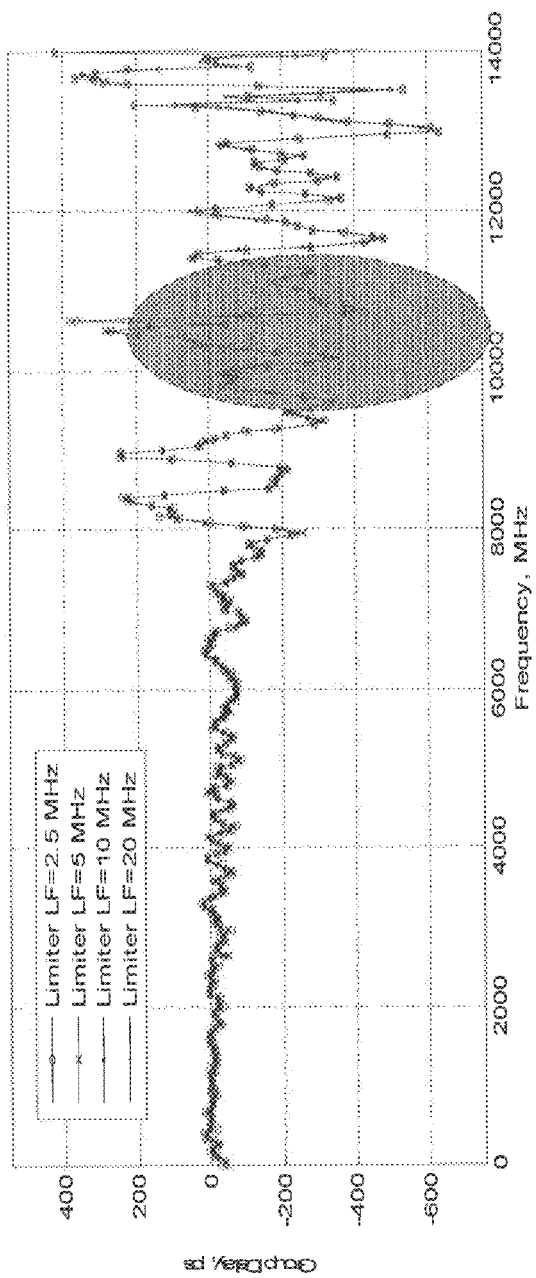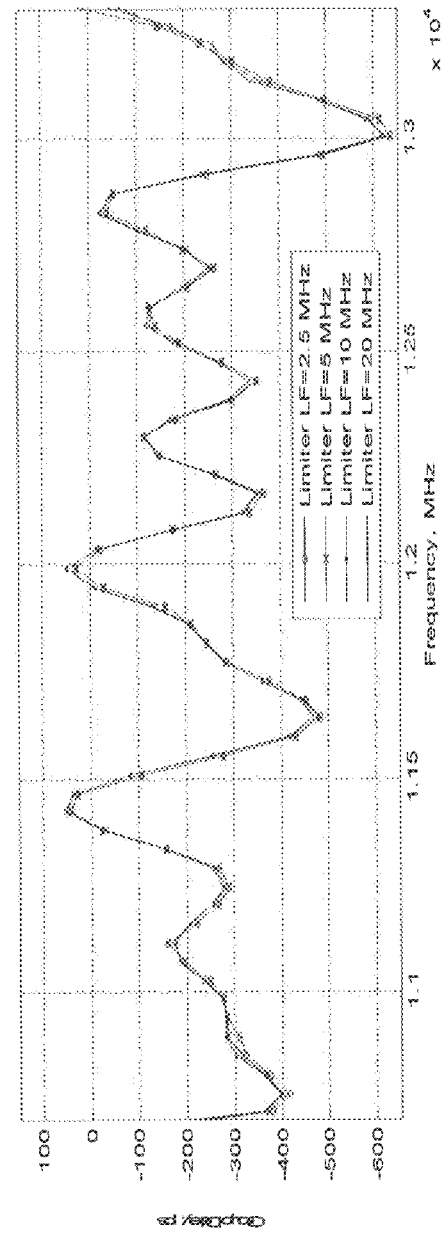

GROUP DELAY MEASUREMENT APPARATUS AND METHOD

FIELD OF THE TECHNOLOGY

The technology relates to a method and apparatus for measurement of group delay caused by a device under test (DUT), including but not limited to signal conversion devices, such as high speed analog to digital converters, analog and digital up-converters, down-converters and others.

BACKGROUND

Signal conversion devices are characterized by a frequency response, consisting of amplitude and phase terms. Correction (equalization) of the frequency response is essential for a high quality converter and requires precise measurement of device properties, and the group delay dependence on frequency in particular.

Analog to digital converters (ADCs) operate in a wide frequency region that extends from baseband frequencies up to the limiting case of high frequencies. It means that group delay of an ADC should be measured in the correspondent wide frequency range. To ensure a precise correction of the frequency response of an ADC or a frequency converter the group delay measurement should be performed with a small enough frequency step: the distance between the adjacent frequencies, at which the group delay is measured should be reasonably small-sized. The apparatus for group delay measurement should be straight forward: it should comprise as few components as possible, and should not require employment of laboratory devices and additional calibration.

Group delay measurements are conventionally performed using Vector Network Analyzers (VNAs). For example, Agilent Application Note 5965-7707E "Understanding the Fundamental Principles of Vector Network Analysis" describes a group delay measurement method which injects a known sinusoidal excitation to an input of the device under test (DUT), and analyzes the phase of the signal at its output. However, that VNA-based method has limitations. First, it requires a DUT to have input and output ports of the same type, As a consequence, that method is not applicable to such devices as ADCs, where the input signal is analog and the output signal is digital. Second, VNA-based method of measurement requires that the input and the output signals lie in the same frequency range. For these reasons, VNA-based group delay measurement cannot be used for frequency converters.

Another prior art method for group delay measurement is based on a time domain pulse shape analysis. The time domain method uses an injection of a known periodic signal (e.g., impulses or rectangular pulses) into a DUT and capturing a waveform at the DUT output. This method is applicable to ADC group delay measurement. Phase distortions introduced by the DUT can be determined using Fourier Transform-based analysis, i.e., obtaining a spectrum (and more generally, the phase response) of the DUT output signal and comparing it with the spectrum (or the phase response) of the input signal, thus obtaining the phase response of the DUT. However, high frequency measurements require expensive and complicated tools for test signal generation, such as a special picosecond pulse source. Signal sources of that kind may have varying group delay, for which reason they must be calibrated before the measurement, using, for example, a high accuracy temporal resolution sampling scope. As a consequence, the measuring apparatus becomes complicated and cumbersome, ruling out the possibility of calibrating an ADC (or like devices) under operating conditions.

European Patent Application No. EP1515147A1 (J. Kraus and C. Kikkert) describes group delay measurement of an ADC based on generating a test signal through modulation of an initial signal consisting of a plurality of spectral components, by a low frequency signal (FIG. 1). With that method, a digitized waveform from the output of a DUT is Fourier transformed. The phase differences between sidebands of initial signal spectral lines are calculated. Group delay at the corresponding frequency is found by dividing the corresponding phase difference by the difference of the sideband frequencies.

A phase difference between the sidebands of the initial signal spectral line contains an unknown phase offset that equals a doubled phase of the low frequency signal. This phase offset causes a corresponding offset in the calculated group delay. As long as the low frequency signal remains unchanged during the measurement, the unknown offset delay is inconsequential—it does not cause distortions of the measured group delay.

The number of spectral lines in the initial signal is limited by the acceptable complexity of the measuring apparatus, and usually is far less than the number of frequencies where group delay is to be measured. A repetition of the measurement, with alteration of the spectral lines frequencies in the initial signal, presents difficulties because it is accompanied by random changes in the phase of the low frequency signal with the a corresponding appearance of the unknown offset in the measured group delay. As a consequence of the limited number of frequencies where group delay is measured, only an approximate correction of frequency response based on these measurements is possible. This factor significantly constrains applicability of this measurement method.

U.S. Pat. No. 8,983,796 (T. Bednorz and S. Neidhardt) describes a different method of group delay measurement based on generation of two sine wave signals with different frequencies $f_1$ and $f_2$. This method is schematically illustrated in FIG. 2. The input signals $f_1$, $f_2$ from two sine wave signal generators 10 and 11 are added in a summer 12. The resultant summed signal is split in a splitter 13 between a reference channel 40 and a DUT 20 followed by a measurement channel 30.

The phase difference of the input signals is measured in reference channel 40 using a mixer 41 which uses a local oscillator signal $f_{LO}$ to translate the summed signal from splitter 13 to a low frequency signal including components derived from input signals $f_1$, $f_2$. That two component low frequency signal is processed to perform phase detection using a digital quadrature circuit consisting of low pass filters (LPFs) 42 and 43 followed by analog to digital converters (ADCs) 44 and 45 respectively, followed by a phase detector 60. In this configuration, the outputs of ADCs 44 and 45 are input to phase detector 60, which may be implemented as quadrature phase detector.

The phase difference of the output of the DUT is measured in measurement channel 30 followed by a phase detector 50, which are similar to reference channel 40 and phase detector 50. In particular, measurement channel 30 includes a mixer 31 which uses a local oscillator signal $f_{LO}$ to translate the summed signal from splitter 13 and the DUT 20 to a low frequency signal including components derived from input signals $f_1$, $f_2$. That two component low frequency signal is processed to perform phase detection using a digital quadrature circuit consisting of low pass filters (LPFs) 32 and 33 followed by analog to digital converters (ADCs) 34 and 35 respectively, followed by phase detector 50. In this configuration, the outputs of ADCs 34 and 35 are input to phase detector 50, which may be implemented as quadrature phase detector.

The frequencies $f_1$, $f_2$ of the input sine wave signals are swept within a frequency band of interest and group delay measurement is obtained by subtracting the reference phase difference (at the output of phase detector 60) from DUT 20 phase difference (at the output of phase detector 60) in a group delay calculation unit 70. This method also has a number of disadvantages and suffers from circuit complexity. It is not possible to measure group delay of an ADC at low frequencies. Moreover, there is a need for wideband mixers 31 and 41 which are used for providing signal down-conversion. The down-conversion step includes use of low pass filters 32, 33, 42 and 43, which may introduce additional phase distortions and so must be precisely matched for four quadrature branches (reference and measurement). Also, each quadrature channel is digitized by separate ADCs 34, 35, 44 and 45, which may have frequency mismatch and, as a consequence, introduce phase errors.

There is a need in a method and a simple apparatus for group delay measurement which may be applied to signal conversion devices and which provide for precise measurement of group delay in a wide frequency band at frequently repeated frequencies by separate tests for different sets of frequencies.

SUMMARY

Method and apparatus for group delay measurement according to the present technology comprises means for generating a test signal using two sinusoidal signal sources at low and high frequencies, followed by amplitude limiting of a sum of those signals. This test signal is injected into a DUT. A digitized waveform of the amplitude limited signal is obtained, and group delay, is determined by simultaneous measurement of signal sideband components and low frequency fundamental phases. The method is applicable to signal conversion devices, such as ADCs, up-converters and down-converters.

BRIEF DESCRIPTION OF THE DRAWINGS

FIG. 7a illustrate results of a numerical simulation of the method of technology for an experimental group delay measurement of a 40 Gs/s ADC; and FIG. 7b shows a zoomed region of FIG. 7a in the range 10700 to 13300 MHz.

DETAILED DESCRIPTION

Figure 1:
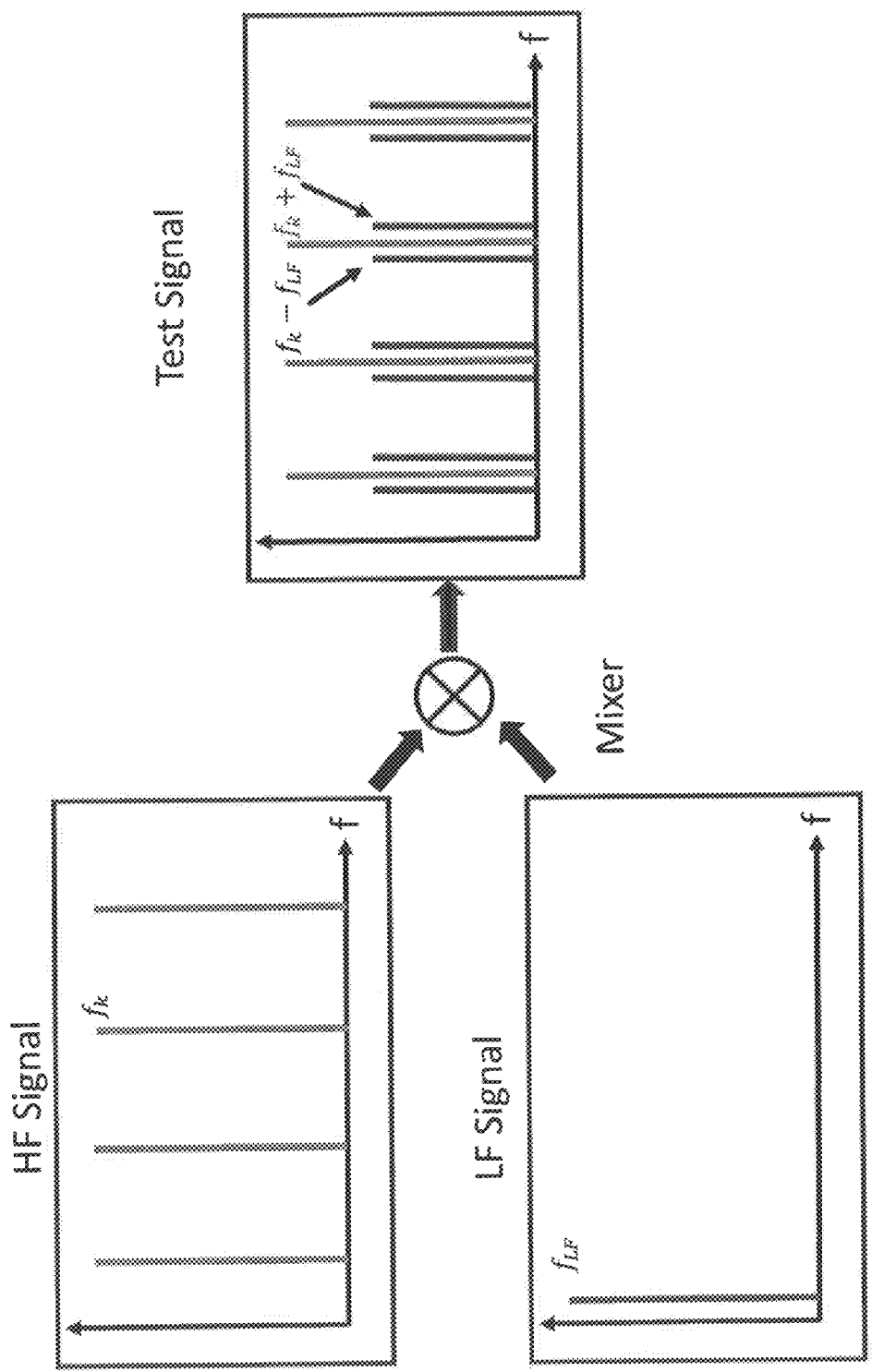
FIG. 1 depicts a method for generating components of a signal spectrum using a mixer for use in a prior art group delay measurement system.
Figure 2:
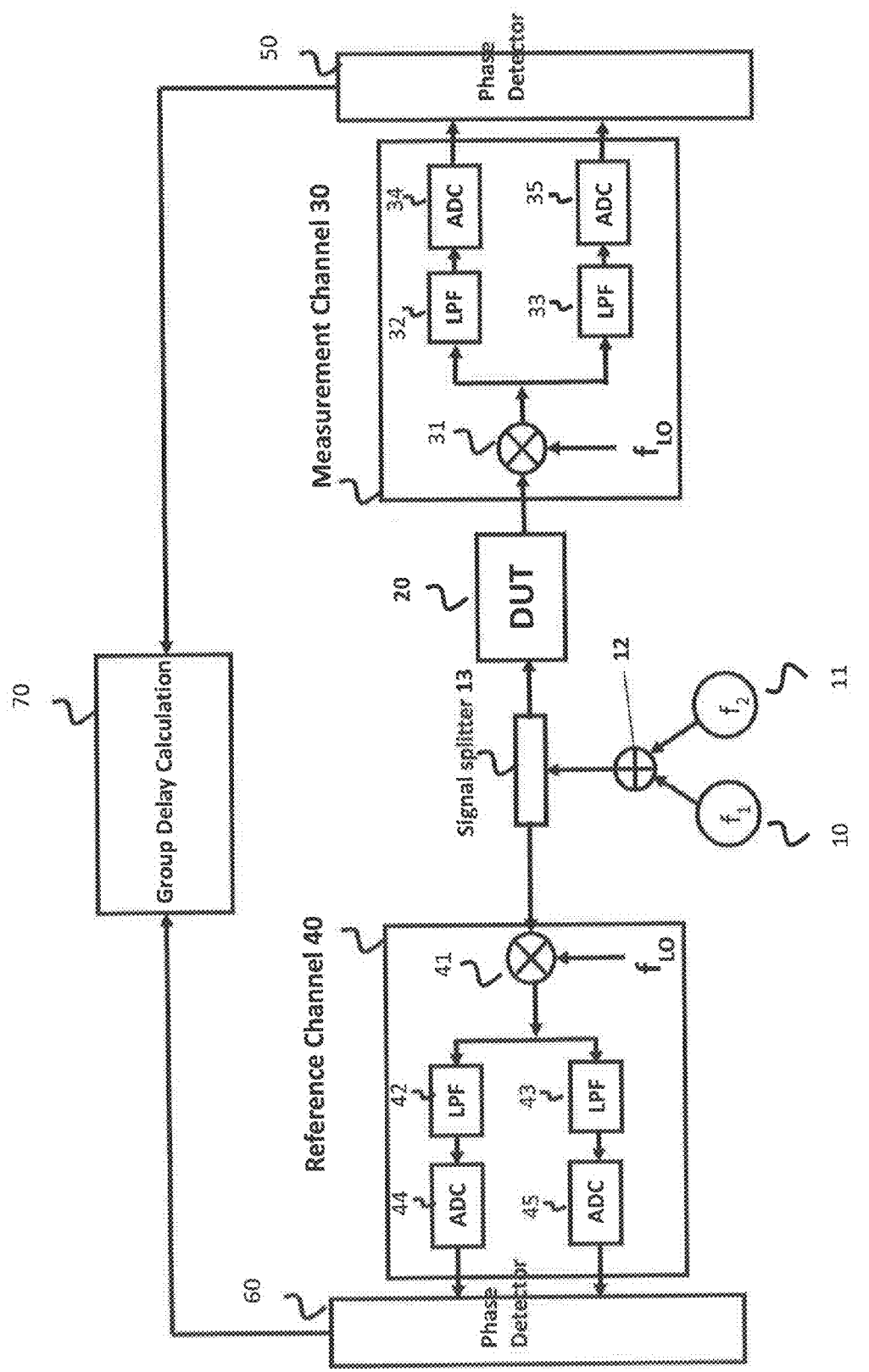
FIG. 2 depicts a block diagram of prior art group delay measurement system using separate reference and measurement signal paths.
Figure 3:
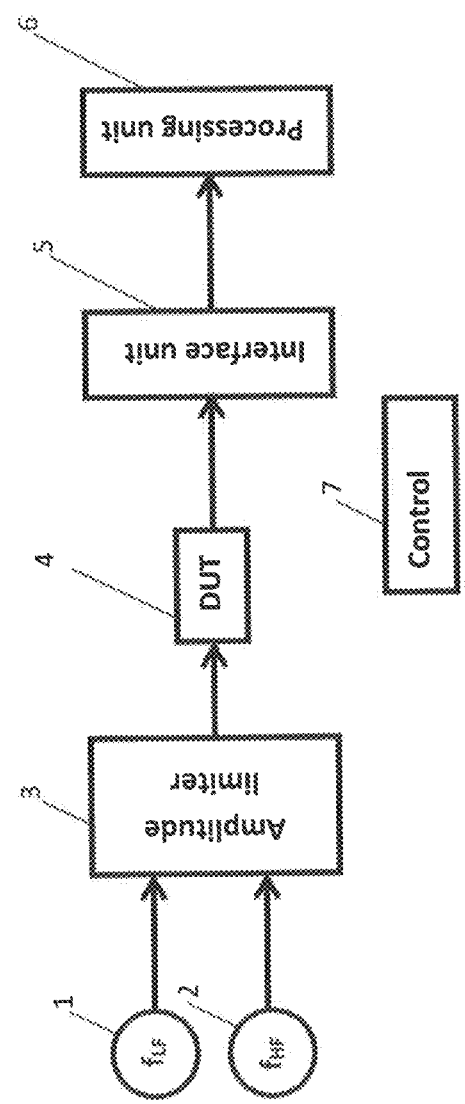
FIG. 3 shows a block diagram of an exemplary group delay measurement system according to the current technology.

A block diagram of an exemplary apparatus for group delay measurement, according to the current technology, is shown in FIG. 3. The apparatus comprises two sine wave oscillators: a low frequency sine wave oscillator 1, generating a low frequency $f_{LF}$, and a high frequency sine wave oscillator 2, generating a high frequency $f_{HF}$. Output signals of oscillators 1 and 2 are connected to the inputs of an amplitude limiter 3. A signal formed in amplitude limiter 3 is applied to an input of a DUT 4. A signal from an output of DUT 4 is processed in a processing unit 6. An interface unit 5 is coupled between the output of DUT 4 and an input of processing unit 6. The interface unit 5 converts the signal from the output of DUT 4 into a form that matches the input of processing unit 6.

A control unit 7 manages the process of measurement step by step, establishing a frequency $f_{HF}$ for each step of measurement, and determining group delay of DUT 4 for harmonics $k \cdot f_{HF}$ of the frequency $f_{HF}$ that had been set.

Figure 4A:
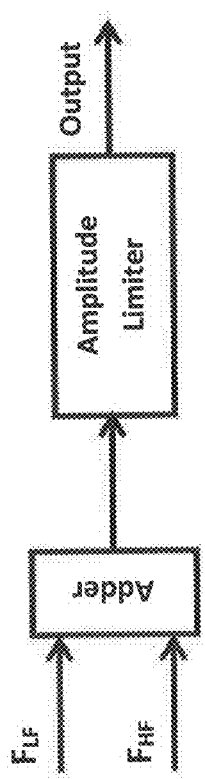
FIG. 4a shows an exemplary amplitude limiter of the configuration of FIG. 3, configured as a cascade connection of an adder and an amplitude limiter.
Figure 4B:
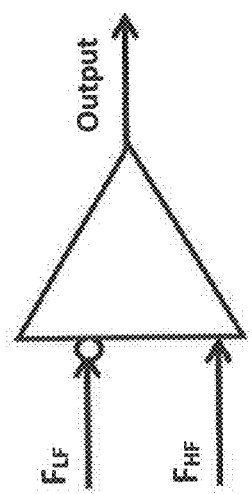
FIG. 4b shows an exemplary amplitude limiter of the configuration of FIG. 3, configured as a limiting amplifier.

The amplitude limiter 3 may be constructed as a cascade connection of an adder with a limiting amplifier (for example, as shown in FIG. 4a), or as a limiting amplifier with a differential input (for example, as shown in FIG. 4b). In both cases, the formed test signal presents a limited sum of two sine waves.

Figure 5A:
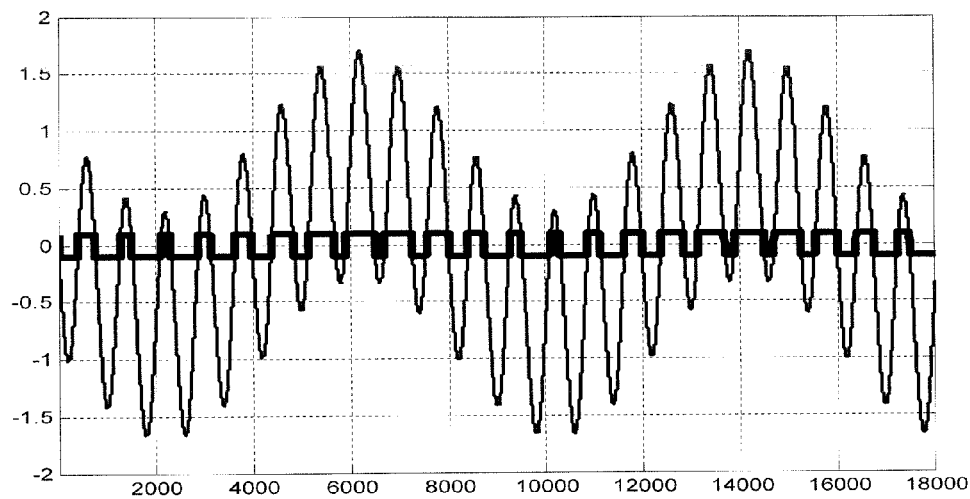
FIG. 5a illustrates an exemplary waveform at the output of an amplitude limiter in a form of the technology.

A signal at the output of amplitude limiter 3 is shown in FIG. 5a, where, as an example, a mix of two sine waves is amplitude limited at a threshold level of 10% from the original amplitude. A sum of the low and high frequency signals at the output of the amplitude limiter 3 is transformed into a sequence of width modulated pulses. During a positive half period of the low frequency, those pulses have narrower negative-going, and wider positive-going, widths. During negative half period, the negative-going polarity pulses are wider, and the positive-going polarity pulses are narrower. This pulse width modulation is periodic, with the period of low frequency signal. As a result, a low frequency component at $f_{LF}$ is present at the output of amplitude limiter 3, with the phase of this low frequency signal being equal the phase of original low frequency sine wave.

Figure 5B:
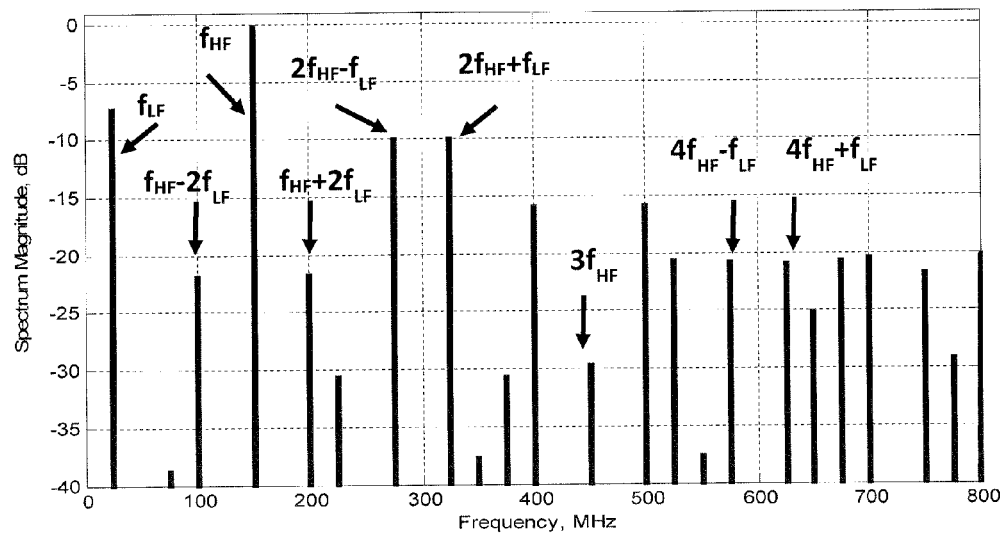
FIG. 5b illustrates an exemplary spectrum at the output of an amplitude limiter in a form of the technology.

The relationship between the voltage at the output of the amplitude limiter, and the voltage at its input, may be approximated by a Taylor series decomposition having odd components, i.e., by a polynomial of the form $ax+bx^3+cx^5 \ldots$ . As a result, the spectrum of the signal at the output of amplitude limiter 3 comprises multiple combination frequencies $k \cdot f_{HF} \pm n \cdot f_{LF}$, where k, n are integers and k+n is an odd number. An illustrative example of the spectrum at the output of the amplitude limiter 3 for $f_{LF}$=25 MHz, $f_{HF}$=150 MHz, is shown in FIG. 5b. The main spectral peak corresponds to the first harmonic of the high frequency sine wave; the magnitude spectrum is normalized to 0 dB at $f_{HF}$=150 MHz. As seen, the spectrum has distinct low frequency spectral component at 25 MHz, and a number of combination frequencies (sidebands). The highest sideband magnitude is around second harmonic of the high frequency signal, i.e., at $2 \cdot f_{HF} \pm f_{LF}$, with −10 dB magnitude. The dominance of sidebands at the second harmonic is explained by the fact that the signal consists of a sequence of width-modulated rectangular pulses. It is well known that asymmetry of pulse period generates even signal harmonics while a perfectly symmetrical pulse train has only odd harmonics. The asymmetry of modulated pulses is opposite for positive and negative half periods of the low frequency signal. Therefore, the average asymmetry over a full period of the low frequency signal is zero and the second harmonic of the high frequency signal is not present. However, modulation of pulse width asymmetry with frequency $f_{LF}$ causes an appearance of sidebands around a second harmonic at $2 \cdot f_{HF} \pm f_{LF}$. Weaker sidebands are also present at the fourth harmonic $4 \cdot f_{HF} \pm f_{LF}$; second-order sidebands are present at $f_{HF} \pm 2 \cdot F_{LF}$ and $3 \cdot f_{HF} \pm 2 \cdot f_{LF}$. All sideband pairs can be used for phase and group delay measurements. The sidebands at the second harmonic of the high frequency signal are preferable due to stronger spectral magnitude and better signal-to-noise ratio.

DUT 4 may be an ADC, for which group delay is to be measured. Alternatively, DUT 4 may be a digital frequency converter with an ADC as the converter component. The current technology makes it possible to measure group delay of analog devices as well. In such cases, an ADC is incorporated in the interface unit 5. In any event, the signal at the input of the processing unit 6 always has a digital form.

Figure 6:
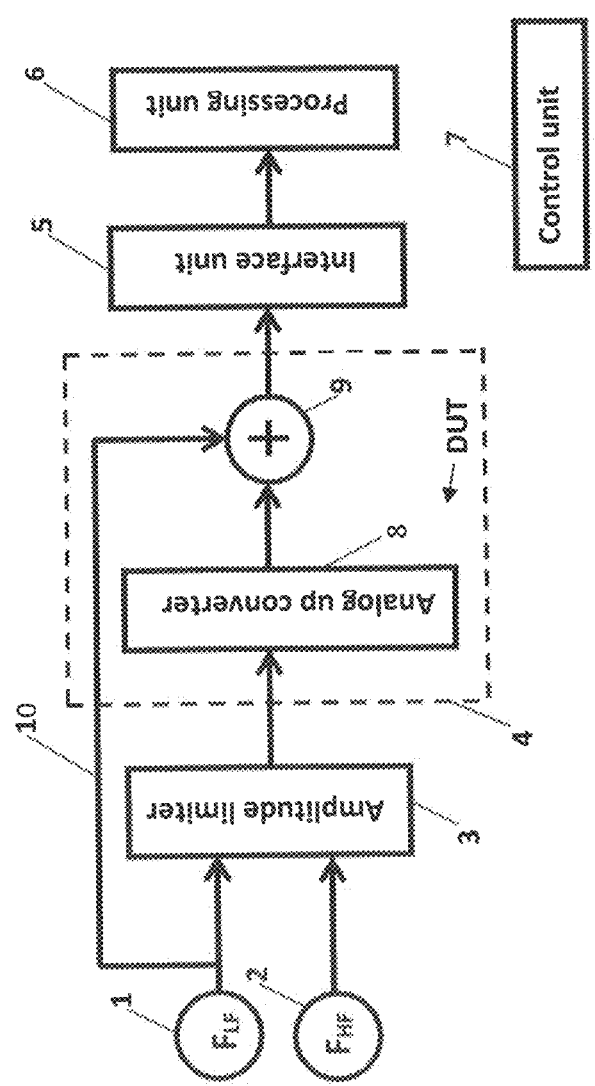
FIG. 6 shows a block diagram of group delay measurement configuration for an analog up converter according to the technology.

In a form, when the technology is used for group delay measurement of an analog up-converter, measures should be used to ensure presence of the component with the frequency $f_{LF}$ in the spectrum of the signal at output of the DUT 4. An exemplary block diagram for this form is shown in FIG. 6. In this block diagram, DUT 4 has an additional input 10 connected to the output of the low frequency oscillator 1. Inside the DUT 4, an adder 9 is coupled between an analog up-converter 8 and the output of the DUT 4. The additional input 10 of DUT 4 is connected to a first input of the adder 9. A second input of adder 9 is connected to an output of analog up-converter 8. The sine wave with frequency $f_{LF}$ produced by the oscillator 1, is applied by way of additional input 10 of DUT 4 to the first input of adder 9. In adder 9, the sine wave of the frequency $f_{LF}$ is mixed with the output signal of analog up-converter 8, and as a part of the mixed signal passes to the output of DUT 4. The availability of the sine wave of the frequency $f_{LF}$ at the input of the processing unit 5 makes possible the measurement of the group delay of the analog up-converter 8 in accordance with the technology.

The signal coming applied to the input of the processing unit 6 may be Fourier transformed, resulting in a complex Fourier spectrum. This operation can be performed using an FPGA, a computer or a dedicated digital processor. Thus, phases of all spectrum components can be obtained from a single Fourier transform. By sweeping the high frequency signal $f_{HF}$ in a band of interest, phase measurements can be obtained for a range of frequencies.

In explanation, DUT 4 has a phase frequency response $\psi_{DUT}(f)$, so that a sine wave with the frequency f passing through DUT 4, experiences a phase shift $\psi_{DUT}(f)$. At the input of DUT 4, the right sideband for the harmonic number k of the high frequency $f_{HF}$, has a frequency=$k \cdot f_{HF} + n \cdot f_{LF}$ and a phase $\phi_{right} = k \cdot \phi_{HF} + n \cdot \phi_{LF}$, where $\phi_{HF}$ and $\phi_{LF}$ are the phases of the sine waves with the frequencies $f_{HF}$ and $f_{LF}$, respectively. After passing through DUT 4, the phase becomes $\phi_{right} = k \cdot \phi_{HF} + n \cdot \phi_{LF} + \psi_{DUT}(k \cdot f_{HF} + n \cdot f_{LF})$. The left sideband for the harmonic number k of the high frequency $f_{HF}$ at the output of DUT 4 has a frequency $k \cdot f_{HF} - n \cdot f_{LF}$ and a phase $\phi_{left} = k \cdot \phi_{HF} - n \cdot \phi_{LF} + \psi_{DUT}(k \cdot f_{HF} - n \cdot f_{LF})$. The phases $\phi_{HF}$ and $\phi_{LF}$ of high and low frequency sine wave oscillators are unknown and different during each signal acquisition. However, the high frequency phase is identical for the right and left sidebands, and therefore the phase difference equals $\Delta\phi = \phi_{right} - \phi_{left} = \psi_{DUT}(k \cdot f_{HF} + n \cdot f_{LF}) - \psi_{DUT}(k \cdot f_{HF} - n \cdot f_{LF}) + 2 \cdot n \cdot \phi_{LF}$.

The low frequency phase $\phi_{LF}$ creates a shift of measured value $\Delta\phi$, wherein this shift is different for each signal acquisition. However, since the low frequency component is always present in the signal spectrum, the value of $\phi_{LF}$ is measured from the signal spectrum and compensated. After this operation, the group delay value $\tau$ is calculated as $\tau = \Delta\phi / (f_{right} - f_{left}) / (2 \cdot \pi) = \Delta\phi / (2 \cdot n \cdot f_{LF}) / (2 \cdot \pi)$. Thus, group delay values are obtained for arbitrary frequency with arbitrary frequency steps, depending on a particular choice of $f_{HF}$ and $f_{LF}$. By choosing small value of the low frequency (e.g., 2-5 MHz), any monotonic and slow changing group delay introduced by the limiter circuit is minimized, while group delay of DUT 4 is obtained with high frequency resolution and accuracy.

The method of current technology can be readily simulated using an idealized amplitude limiter and a 40 Gs/s ADC model. In the simulation, the ADC is modeled using real phase and amplitude frequency responses. A test signal is obtained by mixing a variable high frequency signal in the range of 100 MHz-13 GHz with a 50 MHz step, using a 5 MHz low frequency signal. Both high and low frequency signals are assigned random phase values for each frequency in the measurement range. The sum of the sine waves is amplitude limited and each spectral component is distorted by the frequency response functions of the ADC. When the received signal is mixed with additive white Gaussian noise at 40 dB SNR, the spectrum of the signal is determined using a Fast Fourier transform and group delay is calculated as $\tau(f) = (\Delta\phi - 2 \cdot n \cdot \phi_{LF}) / (2 \cdot n \cdot f_{LF}) / (2 \cdot \pi)$. The result of this simulation using multiple independent measurements coincides with a model group delay within 5 ps accuracy. Different distortions of the amplitude limiter circuit are also modeled, such as asymmetry of positive and negative threshold levels, monotonic group delay and frequency roll-off. None of them degraded measured group delay.

FIGS. 7a and 7b show results of an experimental measurement of a group delay of 40 Gs/s for an interleaved ADC using several independent acquisition sets with different values of low frequency (2.5, 5, 10 and 20 MHz). Each measurement set consisted of a single low frequency value and 640 high frequency values in the range of 20 to 14000 MHz with 21.925 MHz steps. Each digitized waveform size is set at 8 million samples in order to provide sufficient data averaging and high resolution spectral measurement. As seen from FIG. 7a, all data sets result in practically identical measurements of group delay. FIG. 7b shows a zoomed region of FIG. 7a in the range 10700 to 13300 MHz, demonstrating that different low frequency signals (2.5 to 20 MHz) result in nearly identical group delay values, with a maximum deviation less than 10 ps, this accuracy in highly non-uniform high frequency region, is sufficient for all practical purposes.

Although the foregoing description of the embodiment of the present technology contains some details for purposes of clarity of understanding, the technology is not limited to the detail provided. There are many alternative ways of implementing the technology. The disclosed embodiments are illustrative and not restrictive.

What is claimed is:
1. A method of group delay measurement for a device under test (DUT) having an input for receiving a signal characterized by a first domain, and an output for providing an output signal characterized by a second domain in response to the input signal received by the input, comprising the steps of:
  a. controlling a signal generator to generate a test signal, wherein the test signal includes as spectral components:
    i. a sine wave characterized by a relatively low frequency $f_{LF}$;
    ii. a set of harmonics of a sine wave characterized by a relatively high frequency $f_{HF}$;
    iii. a set of L pairs of sideband components characterized by frequencies $k \cdot f_{HF} \pm 2 \cdot f_{LF}$, where k is an odd number;
    iv. a set of M pairs of sideband components characterized by frequencies $k \cdot f_{HF} \pm f_{LF}$, where k is an even number;
    wherein phase $\varphi_{right}(k)$ of the sideband components with frequencies $k \cdot f_{HF} + n \cdot f_{LF}$, and phase $\varphi_{left}(k)$ of the sideband components with frequencies $k \cdot f_{HF} - n \cdot f_{LF}$, are related to the phase $\varphi_{LF}$ of the component with frequency $f_{LF}$ and phase $\varphi_{HF}$ of the component with the frequency $f_{HF}$, by equations $$\varphi_{right} = k \cdot \varphi_{HF} + n \cdot \varphi_{LF},$$

$$\varphi_{left} = k \cdot \varphi_{HF} - n \cdot \varphi_{LF},$$

b. applying the test signal to the input of a device under test and
  c. obtaining from the output of the device under test, an output signal responsive to the test signal applied to the input with a phase measuring device by:
    i. measuring phase $\varphi_{LF}$ of a component thereof characterized by frequency $f_{LF}$;
    ii. measuring the phase $\varphi_{right}(k)$ of sideband components thereof characterized by frequencies $k \cdot f_{HF} + 2 \cdot f_{LF}$ and phase $\varphi_{left}(k)$ of sideband components with the frequencies $k \cdot f_{HF} - 2 \cdot f_{LF}$ for odd numbers k; and
    iii. measuring phases $\varphi_{right}(k)$ of the sideband components thereof characterized by frequencies $k \cdot f_{HF} + f_{LF}$ and $\varphi_{left}(k)$ of the sideband components with the frequencies $k \cdot f_{HF} - f_{LF}$ for even numbers k; and
  d. analyzing the measured phases by:
    i. calculating with a digital processor, a group delay $\tau_k$ at frequencies $k \cdot F_{HF}$ according to:

$$\tau_k = (\varphi_{right}(k) - \varphi_{left}(k) - 4 \cdot \varphi_{LF})/(4 \cdot f_{LF}) \text{ where } k \text{ is odd,}$$
and $$\tau_k = (\varphi_{right}(k) - \varphi_{left}(k) - 2 \cdot \varphi_{LF})/(2 \cdot f_{LF}) \text{ where } k \text{ is even;}$$
and ii. determining with a digital processor, group delay for N frequencies in a range of interest by repeating N/(L+M) times, the set of steps a, . . . , c, each time for a value of the frequency $f_{HF}$.

2. The method of group delay measurement according to claim 1, wherein the generating of the test signal is performed by producing two sine waves with respective frequencies $f_{LF}$ and $f_{HF}$, summing the two sine waves, and amplitude limiting the resultant sum by applying the summed sine waves to than amplitude limiter.

3. The method of group delay measurement according to claim 2, wherein the measured phases of the spectral components of the output signal are determined by a digital processor calculating a Fast Fourier Transform (FFT) of the signal at the output of the device under test.

4. The method of group delay measurement according to claim 2, wherein the producing of each of the two sine waves is performed by an oscillator.

5. The method of group delay measurement according to claim 2, wherein the summing of the two sine waves is performed by an adder.

6. The method of group delay measurement according to claim 2, wherein the summing of the two sine waves and amplitude limiting is performed by applying the two sine waves to differential inputs of a limiting amplifier.

7. The method of group delay measurement according to claim 1, wherein the first domain includes frequencies in a first range, and the second domain includes frequencies in a second range.

8. The method of group delay measurement according to claim 7, wherein range of frequencies of the first domain is lower than the range of frequencies of the second domain.

9. The method of group delay measurement according to claim 7, wherein range of frequencies of the first domain is higher than the range of frequencies of the second.

10. The method of group delay measurement according to claim 1, wherein the first domain is an analog domain, and the second domain is a digital domain.

11. The method of group delay measurement according to claim 1, wherein the first domain is a digital domain, and the second domain is an analog domain.

12. An apparatus for group delay measurement for a device under test (DUT) having an input for receiving a signal characterized by a first domain, and an output for providing an output signal characterized by a second domain in response to the input signal received by the input, comprising:
  a. a first oscillator providing at an output, wherein the sine wave is characterized by a relatively low frequency $f_{LF}$;
  b. a second oscillator providing at an output, wherein the sine wave is characterized by a relatively high frequency $f_{HF}$;
  c. an amplitude limiter including a first input, a second input and an output, wherein the first input is connected to the output of the first oscillator, the second input is connected to the output of the second oscillator, and the output is connected to the input of a device under test, and
  wherein the amplitude limiter is configured to produce at the output thereof, a test signal corresponding to an amplitude limited sum of the inputs to the amplitude limiter, wherein the test signal includes as spectral components:
    i. a sine wave characterized by a relatively low frequency $f_{LF}$;
    ii. a set of harmonics of a sine wave characterized by a relatively high frequency $f_{HF}$;
    iii. a set of L pairs of sideband components characterized by frequencies $k \cdot f_{HF} \pm 2 \cdot f_{LF}$, where k is an odd number;
    iv. a set of M pairs of sideband components characterized by frequencies $k \cdot f_{HF} \pm f_{LF}$, where k is an even number;
    wherein phase $\varphi_{right}(k)$ of the sideband components with frequencies $k \cdot f_{HF} + n \cdot f_{LF}$, and phase $\varphi_{left}(k)$ of the sideband components with frequencies $k \cdot f_{HF} - n \cdot f_{LF}$, are related to the phase $\varphi_{LF}$ of the component with frequency $f_{LF}$ and phase $\varphi_{HF}$ of the component with the frequency $f_{HF}$, by equations $$\varphi_{right} = k \cdot \varphi_{HF} + n \cdot \varphi_{LF},$$

$$\varphi_{left} = k \cdot \varphi_{HF} - n \cdot \varphi_{LF};$$

d. a measurement unit having an input configured to receive a signal from the output of the device under test in a predetermined domain
wherein the measurement unit includes a phase measuring device operative on the signal received from the output of the device under test for:
i. measuring phase $\varphi_{LF}$ of a component thereof characterized by frequency $f_{LF}$;
ii. measuring the phase $\varphi_{right}(k)$ of sideband components thereof characterized by frequencies $k \cdot f_{HF} + 2 \cdot f_{LF}$ and phase $\varphi_{left}(k)$ of sideband components with the frequencies $k \cdot f_{HF} - 2 \cdot f_{LF}$ for odd numbers k; and
iii. measuring phases $\varphi_{right}(k)$ of the sideband components thereof characterized by frequencies $k \cdot f_{HF} + f_{LF}$ and $\varphi_{left}(k)$ of the sideband components with the frequencies $k \cdot f_{HF} - f_{LF}$ for even numbers k; and
e. a processing unit for analyzing the measured phases from the measurement unit, to determine a group delay for frequencies $f_{LF}$ and $f_{HF}$ for the device under test, by: calculating with a digital processor, a group delay $\tau_k$ at frequencies $k \cdot F_{HF}$ according to:

$$\tau_k = (\varphi_{right}(k) - \varphi_{left}(k) - 4 \cdot \varphi_{LF})/(4 \cdot f_{LF}) \text{ where } k \text{ is odd, and}$$

$$\tau_k = (\varphi_{right}(k) - \varphi_{left}(k) - 2 \cdot \varphi_{LF})/(2 \cdot f_{LF}) \text{ where } k \text{ is even; and}$$

f. an interface unit having an input connected to the output of the device under test and an output connected to the input of the processing unit, said interface unit being configured to provide the output of the device under test in the predetermined domain to the input of the processing unit; and
g. a control unit configured to arrange measurement performance step by step, to establish the frequency $f_{HF}$ for each step of measurement and to determine group delay of the device under test for harmonics $k \cdot f_{HF}$ of the frequency $f_{HF}$.

13. The apparatus for group delay measurement according to claim 12, wherein the processing unit determines phases of input signal spectral components by performing a Fast Fourier Transform (FFT) on the received signal.

14. The apparatus for group delay measurement according to claim 12, wherein the amplitude limiter includes an adder configured to receive the sine waves from the first oscillator and the second oscillator and provide at an output of the adder, a sum of the received sine waves, and provide at the output of the amplitude limiter, an amplitude limited form of the sum.

15. The apparatus for group delay measurement according to claim 12, wherein the amplitude limiter includes an amplifier with differential inputs configured to receive the sine waves from the first oscillator and the second oscillator, and to provide at an output of the amplitude limiter, an amplitude limited form of a sum of the signals at the differential inputs.

16. The apparatus for group delay measurement according to claim 12, wherein the device under test is an analog to digital converter.

17. The apparatus for group delay measurement according to claim 12, wherein the apparatus is configured to receive a digital frequency converter as a device under test.

18. The apparatus for group delay measurement according to claim 12, wherein the apparatus is configured to receive an analog device as a device under test.

19. The apparatus for group delay measurement according to claim 12, wherein the apparatus is configured to measure group delay of an analog up converter having an input and an output, as a device under test, and further comprising:
an adder including:
i. a first input configured to receive the sine wave characterized by a relatively low frequency $f_{LF}$ from the first oscillator,
ii. a second input configured to receive the output of the device under test, and
iii. an output coupled to the input of the processing unit, wherein the adder is configured to provide a sum of the sine wave at the first input and output of the analog up converter to the input of the processing unit.

20. The group delay measurement apparatus according to claim 12, wherein the first domain includes frequencies in a first range, and the second domain includes frequencies in a second range.

21. The group delay measurement apparatus according to claim 20, wherein range of frequencies of the first domain is lower than the range of frequencies of the second domain.

22. The group delay measurement apparatus according to claim 20, wherein range of frequencies of the first domain is higher than the range of frequencies of the second domain.

23. The group delay measurement apparatus according to claim 12, wherein the first domain is an analog domain, and the second domain is a digital domain.

24. The group delay measurement apparatus according to claim 12, wherein the first domain is a digital domain, and the second domain is an analog domain.

* * * * *